United States Patent [19]

Miller

[11] 4,017,746

[45] Apr. 12, 1977

[54] TIMING CIRCUIT MEANS

[75] Inventor: Gerald K. Miller, Hersey, Mich.

[73] Assignee: Nartron Corporation, Reed City, Mich.

[22] Filed: July 18, 1975

[21] Appl. No.: 597,161

[52] U.S. Cl. .............................. 307/293; 328/131; 361/197

[51] Int. Cl.² .................. H03K 5/13; G01R 29/02; H01H 47/32

[58] Field of Search .......................... 328/129–131; 307/217, 265, 273, 293; 317/141 S, 148.5 B

[56] References Cited

UNITED STATES PATENTS

| 3,165,644 | 1/1965 | Clapper | 307/217 |
|---|---|---|---|
| 3,388,346 | 6/1968 | Roof et al. | 307/265 |
| 3,660,692 | 5/1972 | Bartlett | 307/273 |
| 3,735,154 | 5/1973 | Meeker et al. | 307/273 |
| 3,909,635 | 9/1975 | Maida | 307/265 |

FOREIGN PATENTS OR APPLICATIONS 901,462  7/1962  United Kingdom ............... 328/131

Primary Examiner—Stanley D. Miller, Jr.
Attorney, Agent, or Firm—Lon H. Romanski

[57] ABSTRACT

A timing circuit is shown as employing a flip-flop for driving an output circuit portion as to have such output circuit portion in effect provide either a low or no output or a high output with such in turn being employed for turning on or turning off a related power circuit; a first high gain amplifier is employed as a means for placing the flip-flop into one of its states whenever an appropriate trigger signal is momentarily applied thereto, while a second high gain comparator amplifier is effective to provide a reset signal to the flip-flop whenever a particular span of time has elapsed from the application of the trigger signal; the timing for creating the reset signal is achieved as through an R-C network which provides, in effect, a threshold signal to the second amplifier upon the application of which the second amplifier produces the reset signal and applies it to the flip-flop thereby placing the output circuit portion in a condition wherein it has either a low or no output. Additional defeat or inhibiting means are provided to cause the output circuit portion to be placed in such a condition of either low or no output even if the timing phase of the overall cycle has not been completed.

9 Claims, 1 Drawing Figure

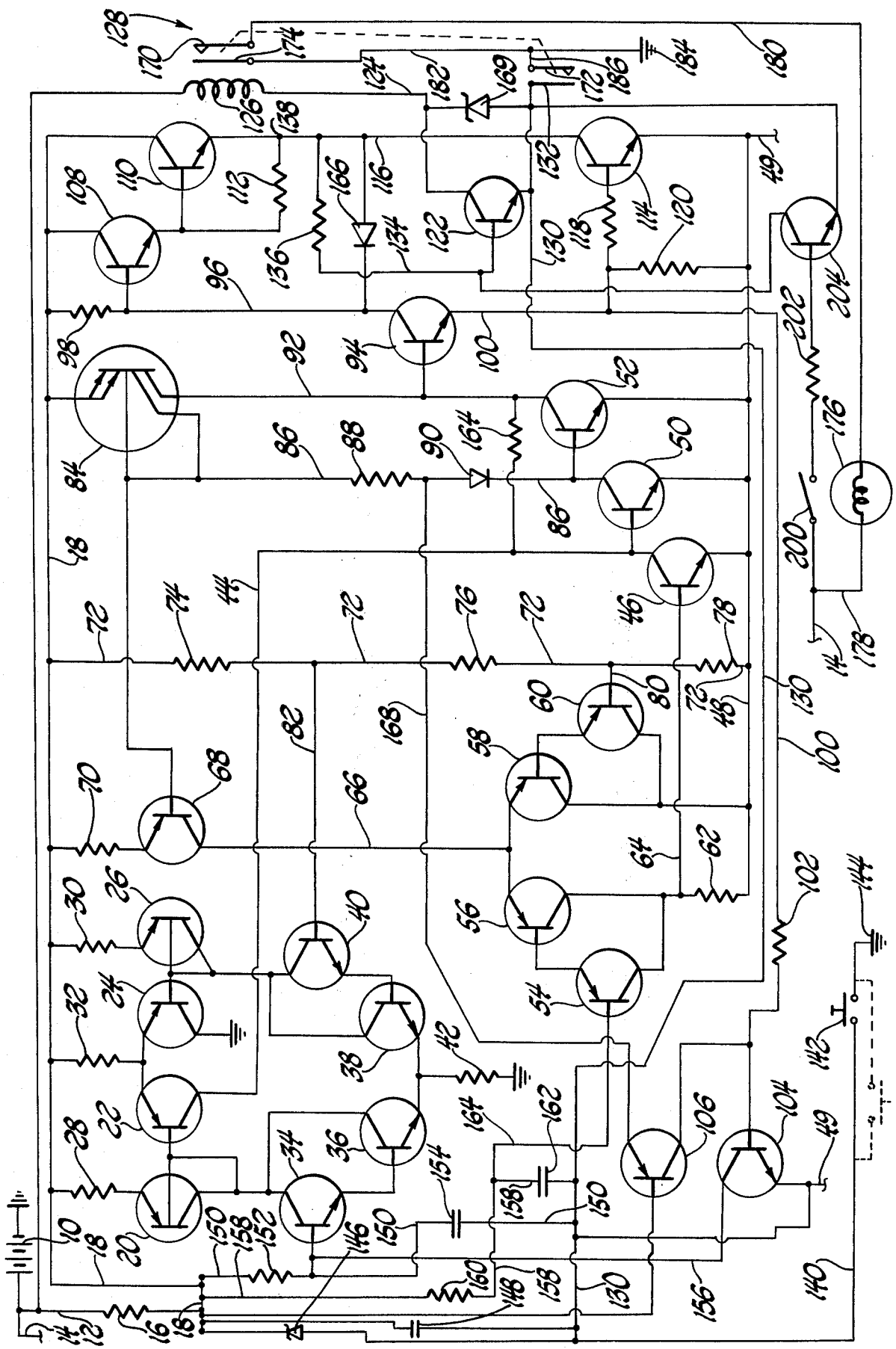

TIMING CIRCUIT MEANS

BACKGROUND OF THE INVENTION

Heretofore, various electrical timing means have been proposed. However, such have either been found to be unreliable, costly and/or unable of application to various specific operating environments and few if any have been found to have the degree of flexibility required in order to easily provide the desired or required timing functions. Further, others have been found to be susceptible to being re-cycled during the actual timing phase of the operating cycle even where such re-cycling was deleterious to the overall system.

Accordingly, the invention as herein disclosed and claimed is primarily directed to the solution of the above as well as other related and attendant problems.

SUMMARY OF THE INVENTION

According to the invention, a timing circuit employs a flip-flop for driving an output circuit portion as to have such output circuit portion in effect provide either a low or no output or a high output with such in turn being employed for turning on or turning off a related power circuit; a first high gain amplifier is employed as a means for placing the flip-flop into one of its states whenever an appropriate trigger signal is momentarily applied thereto, while a second high gain comparator amplifier is effective to provide a reset signal to the flip-flop whenever a particular span of time has elapsed from the application of the trigger signal; the timing for creating the reset signal is achieved as through an R-C network which provides, in effect, a threshold signal to the second amplifier upon the application of which the second amplifier produces the reset signal and applies it to the flip-flop thereby placing the output circuit portion in a condition wherein it has either a low or no output. Additional defeat or inhibiting means are provided to cause the output circuit portion to be placed in such a condition of either low or no output even if the timing phase of the overall cycle has not been completed.

BRIEF DESCRIPTION OF THE DRAWINGS

The single drawing is a schematic wiring diagram illustrating timing circuit means employing the teachings of the invention.

DETAILED DESCRIPTION OF THE PREFERRED EMBODIMENTS

Referring now in greater detail to the single drawing, a suitable source of electrical potential 10 is shown as having one terminal connected to ground while its other terminal is connected as to conductor means 12 and 14 with such conductor 12 having a series resistor 16 therein through which a subsequent conductor 18 is connected.

A first plurality of P-N-P transistors 20, 22, 24 and 26 are arranged as to have the base terminals of transistors 20 and 22 connected to each other and the base terminals of transistors 24 and 26 connected to each other. As shown the emitters of transistors 20 and 26 are each connected to conductor 18 through respective series resistors 28 and 30, while the emitters of transistors 22 and 24 are connected to each other and, through a common juncture, through a resistor 32 to conductor 18.

A first plurality of N-P-N type transistors 34, 36, 38 and 40 are arranged as to have the collector terminals of transistors 34 and 36 connected to each other and as to have the collector terminals of transistors 38 and 40 connected to each other. The emitter of transistor 34 is connected to the base of transistor 36 and, similarly, the emitter of transistor 40 is connected to the base of transistor 38 while the emitters of both transistors 36 and 38 are connected to each other and, as at a common junction, connected to ground through a resistor 42. Further, the collectors of transistors 34 and 36 are connected to the base terminals of both transistors 20 and 22 as well as the collector terminal of transistor 20. Similarly, the collectors of transistors 38 and 40 are connected to the base terminals of both transistors 24 and 26 as well as the collector terminal of transistor 26.

The collector terminal of transistor 24 is connected to ground while the collector of transistor 22 is connected, via conductor means 44, to a collector terminal of an N-P-N transistor 46 which, in turn, has its emitter connected to conductor means 48.

Transistor 46 is functionally coupled to transistors 50 and 52 in a manner as to have the base of transistor 52 connected to the collector of transistor 50 while the base of transistor 50 is connected to the collector of transistor 46. Accordingly, it can be seen that when transistor 46 is in its conductive state ("on") that transistor 50 will be in its nonconductive state ("off") and transistor 52 will be in its conductive state ("on"). The converse is also true; that is, with transistor 46 off, transistor 50 is on and transistor 52 is off.

A second plurality of P-N-P type transistors 54, 56, 58 and 60 are arranged as to have the collectors of transistors 54 and 56 connected to each other and the collectors of transistors 58 and 60 connected to each other. The base of transistor 56 is connected to the emitter of transistor 54 while the emitter of transistor 60 is connected to the base of transistor 58.

The collectors of transistors 58 and 60 are also directly connected to conductor means 48 while the collectors of transistors 54 and 56 are connected to conductor means 48, through resistor means 62, and directly to the base of transistor 46 as by conductor means 64. The emitters of transistors 56 and 58 are connected to each other and, as by a common juncture and conductor means 66, to the collector of a P-N-P transistor 68 which, in turn, has its emitter connected to conductor 18 as through a resistor 70.

A voltage divider network comprises conductor means 72 and serially situated resistance means 74, 76 and 78 which, in the preferred embodiment, are of substantially the same value. As can be seen, the voltage divider is placed electrically across the conductor means 18 and 48.

The base terminal of transistor 60 is connected via 80 to conductor means 72 as to be generally between resistors 76 and 78 while the base terminal of transistor 40 is connected via 82 to conductor means 72 as to be generally between resistors 74 and 76.

A transistor 84, which may be a multi-emitter, multi-collector type, has its base connected to the base of transistor 68 and its emitter terminal connected to conductor means 18. Conductor means 86, comprising serially situated resistor means 88 and diode 90, connects the collector of transistor 50 to the base of each of transistors 84 and 68 as well as to one of the collectors of transistor 84. The other collector of transistor 84 is connected via conductor means 92 to the collector of transistor 52 and to the base of a transistor 94 which, in turn, has its collector connected to conductor means 18 via conductor 96 and resistor 98. The emitter of transistor 94 is, in turn, connected via conductor means 100 and series resistor 102 to both the base of a transistor 104, which has its emitter grounded, and to the collector of a transistor 106.

Further, transistors 108 and 110 are arranged as to each have their collectors connected to conductor means 18 and as to have the base of transistor 110 connected to the emitter of transistor 108 while the base of such transistor 108 is, in turn, connected to conductor 96 and the collector of transistor 94. A resistor 112 is placed in parallel with the base-emitter of transistor 110.

A transistor 114 is shown having its collector connected, as via conductor means 116, to the emitter of transistor 110 while its emitter is connected to conductor means 48 and to ground as at 49. The base of transistor 114 is connected through a resistor 118 to conductor 100 and through a second resistor 120 to conductor means 48.

A power transistor 122 has its collector connected to conductor means 124, and the winding 126 of a related relay assembly 128, leading to the source of potential 10. The emitter of transistor 122 is connected to conductor means 130 which, as generally depicted, has a first end terminating as in a fixed contact 132. The base of transistor 122 is connected via conductor means 134 and resistance means 136 to conductor 116 as at point 138 generally between transistors 110 and 114.

Operationally, the other end of conductor 130 is connected to conductor means 140 leading as to a momentary normally open switch 142 the other fixed contact of which leads to ground as at 144. A zener diode 146 is provided generally across conductors 18 and 130 to thereby provide voltage regulation while capacitor means 148 is provided as a line filter.

An R-C network comprised of conductor means 150, resistor 152 and capacitor 154 is applied generally across conductors 18 and 130. A conductor 156 serves to interconnect the collector of transistor 104 to the base of transistor 34 and also to the conductor means 150 as at a point generally between resistor 152 and capacitor 154. A second R-C network comprising conductor means 158, resistor 160 and capacitor 162 is applied generally across conductors 18 and 130. The base of transistor 54 is connected, as by conductor 164, to conductor means 158 as at a point generally between resistor 160 and capacitor 162. The base of transistor 106 is connected to conductor 18 while the emitter thereof is connected as via conductor 168 to conductor means 86 as at a point generally between resistor 88 and diode 90. A resistor 164 is placed across conductors 44 and 92 while a diode 166 is placed generally across conductors 96 and 116. A zener diode 169 is preferably provided across the emitter-collector of transistor 122 as a voltage protection thereto.

The relay assembly 128 is a normally open double pole relay assembly having ganged or otherwise interconnected movable contacts 170 and 172 respectively adapted to coact with fixed contact portions or means 174 and 132.

An electrical load 176 is connected as via conductor 178 to conductor means 14 and to relay contact 170 as by conductor 180. Further, relay contact 174 is connected as by conductor 182 to ground at 184. Ganged relay contact 172 is also connected to ground 184 as by conductors 186 and 182.

OPERATION OF INVENTION

Transistors 20, 22, 24, 26, 34, 36, 38 and 40 comprise a high gain differential amplifier with the base of transistor 34 comprising an input to the amplifier. The base of transistor 40 is always at the voltage value determined by its connection to the voltage divider so that the base of transistor 40 is at a voltage value which, in this instance, is at substantially two-thirds of the supply voltage above ground. Therefore, anytime that the magnitude of the voltage signal or input on the base of transistor 34 exceeds two-thirds of the supply voltage (the voltage on the base of transistor 40) then the differential amplifier will have an output signal on conductor 44 leading to the flip-flop comprised of transistors 46, 50 and 52 along with transistor 84 to reset the flip-flop from its then existing state to its other operating state.

Generally, the flip-flop is employed to drive the output circuit with such comprising transistors 108, 110, 122 and 114. Generally, when the flip-flop is reset by the differential amplifier transistor 114 is turned on. At that same time transistor 108 will be turned off, transistor 110 will be turned off and transistor 112 will be turned on. Accordingly, it can be seen that point 138 will be brought to substantially ground potential thereby bringing the base of transistor 122 to the same ground potential and thusly maintaining transistor 122 off. Further, it can be seen that as a result of the output signal being placed on conductor 44 to reset the flip-flop, that transistor 46 is turned on, transistor 50 is turned off and transistor 52 is turned on.

Transistors 54, 56, 58 and 60 also comprise a second high gain differential amplifier. The base of transistor 60 is connected to the voltage divider in a manner whereby the said base is at a voltage value equal to one-third of the magnitude of the supply voltage above ground. The base of transistor 54 comprises an input into such second high gain differential amplifier. Whenever a negative voltage pulse is applied to the base of transistor 54, transistors 58 and 60 will be the conducting transistors on while transistors 54 and 56 will be off. In such state with transistors 58 and 60 on and transistors 54 and 56 off, the flip-flop is in a state whereby transistors 46 and 52 are on while transistor 50 is off. With transistor 52 being on it can be seen that in the output circuit transistor 114 is turned off causing the output or point 138 to become a high positive value thusly causing output transistor 122 to be turned on. Of course, at this time with transistor 52 being on, transistor 84 will be off. As should be apparent, transistors 52 and 84 comprise a second flip-flop in that they work opposite to each other so that when one is on the other is off. Prior to transistor being in such an off state, it was in its on state which was brought about when transistor 50 was turned on resulting in a conductive path through the emitter-collector of transistor 50 to the base and collector of transistor 84 thereby turning transistor 84 on.

Generally, in view of the above, it can be seen that point 138 will have two states depending on the operating state of flip-flop transistors 46, 50 and 52. Whenever the output at point 138 is high transistor 122 is turned on thereby energizing relay coil 126 causing contacts 170 and 174 to close as well as contacts 172 and 132 to close. The closure of contacts 170 and 174 closes the circuit through load 176 resulting in the energization of such load.

With further specific reference to the operation, when the normally open switch means 142 is closed (for purposes of discussion let such closure be assumed to be momentary) current flow starts from conductor 18 through conductor 158, causing resistor 160 to start charging the capacitor 162. However, because of the connection from conductor 140 to conductor 130 and the discharged condition of capacitor 162, such closure of switch 142 is sensed as a negative pulse on the base of transistor 54. This then, as previously discussed causes transistors 54 and 56 to be off and transistors 58 and 60 to be on with the ultimate result being that transistor 122 becomes conductive energizing relay coil 126 and closing both sets of contacts 174, 170 and 132, 172 and energizing load 176. At this time, because of the closure of switch 142, current also starts to flow from conductor 18, through resistor 152 to start charging capacitor 154 which has its other electrical side connected to ground via conductor means 150, 130 and 140. (By way of example, in one successful embodiment of the invention resistor 152 had a value of 1-M ohms while the capacitor 154 was rated at 22 micro-farads thereby giving an R-C timing of approximately 22.0 seconds. Further, by way of example, in that same successful embodiment resistor 160 was rated at 560-K while capacitor 162 was rated at 0.1 micro-farads.)

Even if switch 142 is only momentarily closed and then opened, the charging of the R-C circuit comprising resistor 152 and capacitor 154 will continue because of the maintainance of the ground connection through closed contacts 132 and 172. When capacitor 154 finally charges to a value whereby the base of transistor 34 attains a value exceeding two-thirds of the magnitude of the supply voltage, transistor 34 becomes conductive causing a signal to be applied along conductor 44 to the flip-flop of transistors 46, 50 and 52 resulting in transistor 114 being turned on and point 138 becoming brought to ground potential. Consequently, transistor 122 becomes turned off thereby de-energizing relay coil 126 which, in turn, causes the opening of contact sets 174, 170 and 132, 172 as to ultimately de-energize load 176. At this time, transistor 104 is turned on permitting the capacitor 154 to discharge through it and thereby establish the overall circuitry in a state for the initiation of the next cycle whenever such initiation is called for. Further, the values of resistor 160 and capacitor 162 are preferably selected as to prevent the recycling of the entire circuitry as by the prolonged closure or quickly repeated momentary closing of switch 142.

It should be apparent that the invention thusly disclosed provides a timing means for timing, as for example, the energization of any related electrical load.

However, in at least one embodiment, the invention was practiced in a manner whereby the interior or safety lamps of an automotive vehicle, as, for example, an automobile were the electrical load. Accordingly, in such an overall combination, 176 is intended to represent both a single interior or safety lamp as well as a plurality of such lamps which, as a matter of practice, would usually be in parallel with each other. Further the momentary switch 142 could be either the switch which is actuated by the automobile door or doors, or the door latch switch. The first of such switches are commonly employed and situated as in the door pillar as to be opened by the door when the vehicle door is closed and to be closed, as by spring action, when the vehicle door is opened. Obviously, a plurality of such switches could be employed in parallel as generally depicted in dash line on the drawing. The second of such switches could be ones which are closed by the action of manually delatching the door closing or latching mechanism as sometimes take the form of an exteriorly situated push button at or near the external door handle.

The invention also contemplates the provision of a defeat or inhibiting means for de-energizing the load 176 even if the timing means has not yet completed its timing function. For example, especially in an automotive vehicle, if the timing cycle is started and the vehicle operator closes the ignition switch (as for starting the vehicle engine) related switch means 200, closed whenever the vehicular ignition switch or circuit is closed, is provided in series with a resistor 202 and the base of a transistor 204 which, in turn, has its emitter connected to conductor 130 and its collector connected to the base of power transistor 122. Accordingly, if the system is in its timing phase of its cycle and switch 200 is closed (as by the associated closing of the vehicle ignition system) transistor 204 becomes conductive thereby placing the base of transistor 122 at ground potential and causing transistor 122 to be turned off. Consequently, relay coil 126 is de-energized opening contacts 174, 170 and thereby de-energizing interior or safety lamps 176. This then enables the vehicle operator to drive his vehicle without the lamps 176 being lit even if he takes less than time to open and close his door and start the engine than the time provided for by resistor 152 and capacitor 154.

Although only one preferred embodiment and one modification of the invention have been disclosed and described, it is apparent that other embodiments and modifications of the invention are possible within the scope of the appended claims.

I claim:

1. A timing circuit, comprising first switch means operable into first and second operating modes, circuit means including second switch means responsive to said first switch means being in its second operating mode to concurrently energize associated electrical relay switch means and electrical load means, said curcuit means further comprising means for conditioning said second switch means to de-energize said electrical load a predetermined time period subsequent to and independently of operation of said first switch means in said second operating mode, and third switch means having at least two modes of operation, said third switch means when in one of its said two modes being effective to de-energize said electrical relay switch means and said electrical load means within a time span less than said predetermined time period.

2. A timing circuit according to claim 1 wherein said first switch means comprises a first manually actuatable switch assembly, and wherein said third switch means comprises a second manually actuatable switch assembly.

3. A timing circuit according to claim 2 wherein said first manually actuatable switch assembly comprises normally open switch means, and wherein said normally open switch means is closed while in said second operating mode.

4. A timing circuit according to claim 1 wherein said first switch means comprises a manually actuatable switch assembly, and wherein said second switch means comprises solid state high gain amplifier means, solid state flip-flop means, and power switching transistor means.

5. A timing circuit according to claim 1 wherein said first switch means comprises a manually actuatable switch assembly; wherein said second switch means comprises first and second solid state high gain amplifier means, and solid state flip-flop means; and wherein said means for conditioning said second switch means comprises R-C network timing means effective for producing a variable voltage which when a predetermined magnitude thereof is attained is effective for causing said second high gain amplifier means to provide a voltage turn-off signal to said flip-flop means thereby de-energizing said electrical relay switch means and said electrical load means.

6. A timing circuit according to claim 1 wherein said first switch means comprises a manually actuatable switch assembly; wherein said second switch means comprises first and second solid state high gain amplifier means, solid state flip-flop means, and power switching transistor means; and wherein said means for conditioning said second switch means comprises R-C network timing means effective for producing a variable voltage which when a predetermined magnitude thereof is attained is effective for causing said second high gain amplifier means to provide a turn-off voltage signal causing said power switching transistor to be placed in a non-conductive state.

7. A timing circuit, comprising electrical flip-flop means having first and second operating modes, an output circuit portion with output terminal means, said flip-flop means being effective for electrically driving said output circuit portion as to place said output terminal means into either of two states a first of which is an electrical output of relatively high magnitude voltage and the second of which is an electrical output no greater than a relatively low magnitude voltage, said two states of said output terminal means being effective for turning-on and turning-off related power circuit means, first high gain amplifier means effective upon application of an electrical trigger signal thereto for placing said flip-flop means into one of said first and second operating modes, second high gain amplifier means electrically connected to said flip-flop means and effective upon application thereto of an electrical input signal of a predetermined magnitude for placing said flip-flop means into the other of said first and second operating modes, R-C network timing means energizable upon application of said electrical trigger signal and thereupon effective for creating said electrical input signal of a varying magnitude, said electrical input signal of varying magnitude upon attaining said predetermined magnitude being effective to cause said second high gain amplifier means to place said flip-flop means in said other operating mode, manually actuatable switch means effective for creating said electrical trigger signal, holding circuit means associated with said output circuit portion for holding said output circuit portion closed upon termination of said application of said electrical trigger signal, and additional manually actuatable switch means, said additional switch means being effective to cause said holding circuit means to open said output circuit portion even prior to said electrical input signal attaining said predetermined magnitude.

8. A timing circuit according to claim 7 wherein said output circuit portion comprises first transistor means having first base first collector and first emitter terminals, and further comprising second transistor means having second base second collector and second emitter terminals, wherein said second transistor means has its collector-emitter circuit electrically connected to said first base terminal, and wherein said additional manually actuatable switch means is electrically connected to said second base terminal.

9. A timing circuit according to claim 8 wherein said holding circuit means comprises relay means, and wherein said first transistor means upon being placed into conduction is effective for energizing said relay means.

* * * * *

UNITED STATES PATENT OFFICE
CERTIFICATE OF CORRECTION

PATENT NO. : 4,017,746
DATED : April 12, 1977
INVENTOR(S) : Gerald K. Miller

It is certified that error appears in the above-identified patent and that said Letters Patent are hereby corrected as shown below:

Column 2, line 31, change ---on--- to ---"on"---.
Column 4, line 24,27,33,34,45,47,48,51,52,55,57,58,61 and 66, change ---on--- to ---"on"---.
Column 4, line 26, change "112" to ---122---.
Column 4, line 44, change ---on--- to ---("on")---.
Column 5, lines 14,40 and 46 change ---on--- to ---"on"---.
Column 2, lines 30 and 31, change ---off--- to ---"off"---.
Column 4, lines 25,26,31,34,45 (both occurrences), 48,49, 53,56 (both occurrences), change ---off--- to ---"off"---.
Column 5, lines 13 and 42, change ---off--- to ---"off"---.
Column 6, line 28, change ---off--- to ---"off"---.

Signed and Sealed this

Twenty-first Day of February 1978

[SEAL]

Attest:

RUTH C. MASON
Attesting Officer

LUTRELLE F. PARKER
Acting Commissioner of Patents and Trademarks